United States Patent [19]

Lackmann et al.

[11] Patent Number: 5,444,384
[45] Date of Patent: Aug. 22, 1995

[54] METHOD AND DEVICE OF CONTACTLESS MEASUREMENT OF ELECTRIC VOLTAGES IN A UNIT UNDER MEASUREMENT WITH AN INSULATING SURFACE

[75] Inventors: Rainer Lackmann, Düsseldorf; Gerhard Weichert, Dortmund, both of Germany

[73] Assignee: Fraunhofer-Gesellschaft zur Forderung der angewandten Forschung e.V., Munich, Germany

[21] Appl. No.: 104,060
[22] PCT Filed: Jan. 10, 1992
[86] PCT No.: PCT/DE92/00014
 § 371 Date: Aug. 3, 1993
 § 102(e) Date: Aug. 3, 1993
[87] PCT Pub. No.: WO92/14162
 PCT Pub. Date: Aug. 20, 1992

[30] Foreign Application Priority Data
 Feb. 5, 1991 [DE] Germany .......... 41 03 410.4

[51] Int. Cl.$^6$ .............................. G01R 31/28
[52] U.S. Cl. ...................... 324/751; 324/158.1
[58] Field of Search .............. 324/751, 750, 71.3, 324/158.1; 250/310

[56] References Cited

U.S. PATENT DOCUMENTS

| | | | |
|---|---|---|---|
| 3,535,516 | 10/1970 | Munakata | 250/49.5 |
| 3,628,012 | 12/1971 | Plows et al. | 250/49.5 |
| 4,486,660 | 12/1984 | Feuerbaum | 250/310 |
| 4,577,147 | 3/1986 | Frosien et al. | 324/71.3 |
| 4,748,407 | 5/1988 | Brunner et al. | 324/751 |
| 4,864,228 | 9/1989 | Richardson | 250/311 |

FOREIGN PATENT DOCUMENTS 3232671 3/1984 Germany ........ G01R 31/260 P
3331931 3/1985 Germany ........ G01R 31/260 P

OTHER PUBLICATIONS

Menzel, et al., "Electron Beam Probing of Integrated Circuits," in Dec. issue of *Solid State Technology*, pp. 63–70, 1985.
Gorlich, et al., "Capacitive Coupling Voltage Contrast," in vol. II, *Scanning Electron Microscopy*, pp. 447–464.
W. Reiners, "Kapazitiver Potentialkontrast-Theoretische Deutung und technische Nutzung beim Elektronenstrahl-Test passivierter, hochstintegrierter Bausteine" Diss. 1989, Universitat Duisburg, Fachbereich Elektrotechnik.

*Primary Examiner*—Ernest F. Karlsen
*Attorney, Agent, or Firm*—Ralph H. Dougherty

[57] ABSTRACT

A method and device for contactless measurement of electric voltages in a unit under measurement with an insulating surface, a primary electron beam being directed onto the insulating surface of the unit. The energy of the secondary electrons in a secondary electron flow generated at the insulating surface of the unit is measured and the potential of a conducting zone located below the insulating surface of the unit is derived from this measurement. In order to increase the measurement precision, an electric alternating absorption field is generated above the unit under measurement and the measurement of the energy of the secondary electrons is carried out in synchronism with the alternating field.

20 Claims, 1 Drawing Sheet

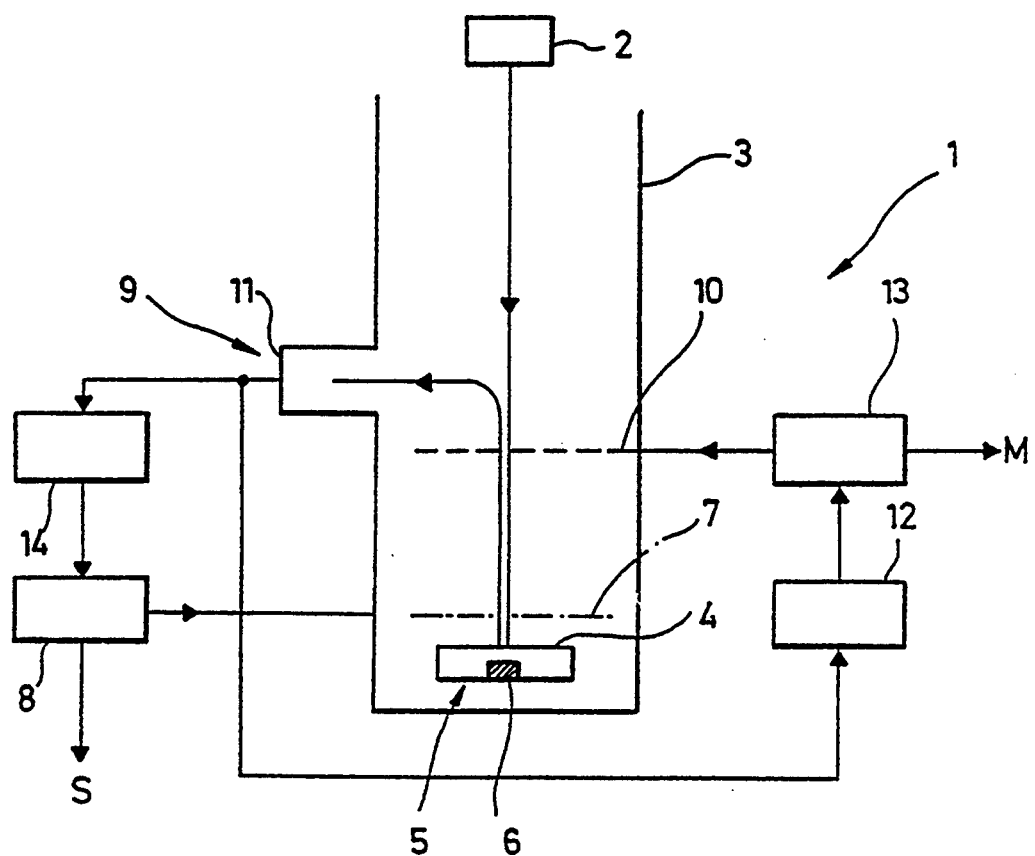

METHOD AND DEVICE OF CONTACTLESS MEASUREMENT OF ELECTRIC VOLTAGES IN A UNIT UNDER MEASUREMENT WITH AN INSULATING SURFACE

FIELD OF THE INVENTION

The present invention refers to a method as well as to a device for contactless measurement of electric voltages in a unit under measurement including an insulating surface and at least one conducting zone lying below the insulating surface.

In particular, the present invention deals with the contactless measurement of electric voltages of conducting zones within passivated, integrated circuits as a non-destructive measurement method and with a measuring device which is suitable for carrying out such a method.

BACKGROUND OF THE INVENTION

Methods for contactless measurement of electric voltages within integrated circuits having a passivated surface are known from E. Menzel, R. Buchanan "Electron Beam Probing of Integrated Circuits" Solid State Technology, December 1985, pages 63 to 70. The measurement device used for carrying out the known contactless voltage measurement method consists of a modified scanning electron microscope and of an electronic control unit. The integrated circuit to be examined is positioned in an evacuated measuring chamber. A primary electron beam generating device directs a primary electron beam onto the surface of the integrated circuit in the "spot mode". This radiation has the effect that secondary electrons are released from the surface of the integrated circuit, the energy of the secondary electrons depending on the potential of the measuring point in the integrated circuit. This energy of the secondary electrons is measured with the aid of a spectrometer. Conclusions with respect to the voltage at the measuring point can be drawn from the measured energy of the secondary electrons. The practical use of this known measurement method as well as of this known measuring device will, however, entail various measuring errors. An essential cause of these measuring errors is the trajectory contrast, which is caused by an inhomogeneous field distribution above the conducting tracks of the integrated circuit. Such inhomogeneous field distribution may, for example, be caused by a crosstalk of the signals from bonding wires or from a neighboring conducting track. In order to reduce the measuring errors caused by the trajectory contrast, it is also known to make use of an absorption net, which is arranged above the integrated circuit and which has applied thereto a high positive voltage in the order of 1000 to 2000 volts.

The technical publication S. Görlich, K. D. Herrmann, W. Reiners, E. Kubalek "Capacitive Coupling Voltage Contrast" Scanning Electron Microscopy, 1986, II, pages 447 to 464, already discloses that the above-described principle of contactless voltage measurement may also be used in connection with integrated circuits, which, for reasons of protection, are covered with a glass-like passivation layer. This passivation layer defines an insulating surface covering the conducting zones of the integrated circuit. When the above-described measurement method is applied to passivated, integrated circuits, secondary electrons will be generated on the insulating surface. The measurement of the potentials of the conducting zones below the insulating surface is made possible by a capacitive coupling between the conducting zones and the insulating surface of the passivation layer.

The measurement of potential variations of a conducting track with the aid of capacitive coupling is, however, only possible in the case of low positive voltages of the absorption net. The use of high absorption voltages will result in a charging of the insulating surface, and this will cause a high potential barrier above the circuit. It follows that, in addition to the measuring errors caused by capacitive coupling, described in W. Reiners, "Kapazitiver Potentialkontrast - Theoretische Deutung und technische Nutzung beim Elektronenstrahl-Test passivierter, höchstintegrierter Bausteine" Diss. 1989, Universität Duisburg, Fachbereich Elektrotechnik, errors caused by the trajectory contrast will occur due to the possible absorption voltages which can be used in such a contactless measurement method for the measurement of electric voltages within integrated circuits having a passivated surface.

SUMMARY OF THE INVENTION

The present invention is based on the finding that when using contactless voltage measurement methods and devices of the type described herein on units having an insulating surface, especially in connection with passivated, integrated circuits, it is not necessary to reduce, for the purpose of preventing interfering charges on the passivation surface, the absorption voltage to such an extent that it will inevitably result in measuring errors caused by the trajectory contrast, but only if the concept that the absorption voltage applied to the absorption net must have a constant value, which is considered as a prerequisite in the prior art, is totally ignored.

Based on this finding, accurate contactless measurements of electric voltages in a unit having an insulating surface and at least one conducting zone underneath the insulating surface, can be carried out using: a primary generating device capable of generating a primary electron beam within an evacuated measuring chamber on two insulating surfaces of the unit; an a.c. absorption voltage source capable of generating an absorption field in the area above the unit; and a device for measuring the energy of electrons of a secondary electron flow which is generated at the insulating surface of the unit. The measuring device must be capable of measuring the secondary electron flow and synchronization with the positive phase of the absorption voltage.

To use this apparatus, the primary electron beam generator directs its beam into the evacuated measuring chamber onto the insulating surface of the unit. This generates a secondary electron flow at the insulating surface of the unit. Thereafter, an electron absorption field is generated above the unit. The potential of the conducting zone is determined by measuring the energy of the electrons of the secondary electron flow which is carried out in synchronization with the application of a positive absorption voltage.

The present invention teaches that, using a method of the type described hereinbefore, the electric absorption field is to be provided in the form of an alternating field, the measurement of the energy of the electrons of the secondary electron flow being carried out only during parts of the period of the alternating field in synchronism therewith.

Accordingly, the present invention teaches that, in a device of the type mentioned above, the absorption voltage source should be provided in the form of an A.C. voltage source, the measuring device used for determining the energy of the electrons of the secondary electron flow working in synchronism with the a.c. voltage signal of the absorption voltage source.

In accordance with a preferred embodiment of the method and apparatus, according to the present invention, rectangular electric absorption fields are used, which are caused by a temporally rectangular absorption net voltage. The voltages at the absorption net preferably alternate between high positive voltages in the order of 1 to 2 kV during a first section of the period duration and a second, low negative voltage in the order of −1 to −100 V. The period duration is chosen such that it is smaller than the charge reversal time constant for the surface charge of the passivation layer of the integrated circuit.

The measurement method and apparatus of the present invention carry out signal evaluation only during parts of the period of the absorption voltage when positive voltage is being applied to the absorption net. The invention thus achieves a strong reduction of the measuring errors caused by the trajectory contrast, although charging of the passivation surface of the integrated circuit is prevented.

OBJECT OF THE INVENTION

It is the object of the present invention to provide a method and a device for measuring voltages within units having an insulating surface with higher accuracy than heretofore possible.

BRIEF DESCRIPTION OF THE DRAWING

A preferred embodiment of the invented measuring device is explained below in detail with reference to the appended drawing, in which:

The single FIGURE is a schematic representation of an embodiment of a device according to the present invention used for contactless measurement of electric voltages within an unit under measurement with an insulating surface.

DETAILED DESCRIPTION

Referring now to the FIGURE, the invented device for contactless measurement of electric voltages, which is generally designated by reference numeral 1, has a primary beam generating device 2, which directs a primary electron beam onto an insulating surface in the form of a passivation layer 4 of an integrated circuit 5 within an evacuated measuring chamber 3. The point where the primary electron beam impinges on the passivation layer 4 being positioned above a conducting zone 6, which defines part of the integrated circuit 5 and which is to be measured with respect to its voltage. Above the integrated circuit 5, when seen in the direction of the incident primary beam, an absorption net 7 is positioned, which has applied thereto an absorption voltage from an absorption source 8. A secondary-electron flow generated at the surface of the passivation layer 4 by the incident primary electron beam is evaluated by a device 9 for measuring the energy of the electrons of the secondary-electron flow. In the preferred embodiment the energy measuring device 9 is a spectrometer and comprises a suppressor grid 10 as well as a detector 11. The suppressor grid 10 is used for carrying out an energy selection of the secondary electrons, since it only allows secondary electrons having a sufficiently high energy to pass to the detector 11. The detector signal is supplied via a high pass 12 to a control device 13, which readjusts the suppressor grid voltage in such a way that the spectrometer characteristic is linearized. The high pass 12 as well as the control device 13 are known per se in connection with such voltage measuring devices 1 so that a detailed explanation of the structure of these components can be dispensed with. The control device 13 additionally produces a measuring signal M on the output side, which is dependant on the energy of the secondary electrons and is, consequently, a yardstick for the voltage of the conducting zone 6 which is to be measured with respect to its voltage.

The detector signal is additionally supplied to a low pass 14 forming the time average value of the detector output signal for the periods of positive absorption voltage.

The absorption voltage source 8 is a square-wave voltage source. The output voltage of the absorption voltage source 8 changes between a high positive voltage of from 1 to 2 kV and a low negative voltage between −1 and −100 volts. During the part of the period in which the high positive voltage it generated, almost all secondary electrons are absorbed. This will result in positive charging of the surface of the passivation layer 4 of the integrated circuit 5 with the charge reversal time constant of its surface charges, which can be in the approximate range between one millisecond and one second.

During the part of the period in which the low negative voltage is generated, almost all secondary electrons will return to the surface of the passivation layer 4 so that the positive charge surplus will be reduced again. The period duration of the square-wave absorption voltage source 8 is chosen such that it is smaller than the charge reversal time constant for the surface charge. The time fluctuations of the surface potential can thus be kept sufficiently small.

The output signal of the low pass 14 is used for controlling the pulse duty ratio of the period of generation of the high positive voltage and of the low negative voltage, respectively, in such a way that, in the time average, a low positive surface potential will occur at the passivation layer 4 of the integrated circuit 5.

Furthermore, whenever the high positive voltage is applied to the absorption net 7, the square-wave absorption voltage source 4 will produce a synchronization signal S by means of which the evaluation of the measuring signal M by an evaluation device (not shown) will be limited to the respective periods of high absorption potential.

Hence, the measurement of the energy of the secondary electrons will be carried out only in time periods in which a high positive voltage is applied to the absorption net so that errors caused by the trajectory contrast will be minimized.

The generation of the primary electron beam is continued without any changes during the time periods in which the absorption net voltage is reduced to the low, negative voltage. However, the signal evaluation of the measuring signal K will be interrupted during these time periods.

In addition, the insulating surface 4 of the unit under measurement can be irradiated areawise during the compensation phase so as to equalize the surface charges formed during the measurement phase. The term measurement phase refers to the time during which the absorption field has within its first part of the period a high field strength with a polarity absorbing the secondary electrons from the insulating surface of the unit under measurement. During this period of time, the primary electron beam is operated in a spot mode for the purpose of measurement. The term compensation phase is used for the period of time corresponding to the second part of the period of the absorption field during which the absorption field will drive back the secondary electrons to the insulating surface 4 of the unit under measurement 5. In view of the fact that, due to the change in the absorption voltage, the primary electron beam is not focussed on the insulating surface 4 of the unit under measurement 5 during the compensation phase, an enlargement of the location of irradiation will already be achieved by the change in the absorption voltage during the compensation phase. In addition, the size and the position of the area exposed to radiation can be influenced by a rasterlike deflection of the primary electron beam during the compensation phase absorption to purposefully reinfluence the local charge distribution on the insulating surface 4 of the unit under measurement 5.

By controlling the dwell time of the primary electron beam, the beam flow, or the raster area, it will be possible to achieve a locally inhomogeneous shift of the surface potential at the insulating surface 4 of the unit under measurement 5 of such a nature that, during the measurement phase the point of impingement of the primary electron beam lies within the area in which the secondary electrons will be retarded during the compensation phase; the charging can thus be controlled.

Deviating from the above-described control and compensation, of the surface charges by varying the irradiation with primary electrons, it is also possible to carry out a purposeful deflection of the secondary electrons during the respective second part of the period of the absorption field, i.e. during the compensation phase. Just as in cases in which the measure which has been described first is applied, it will be possible to achieve the goal that the area irradiated during the measurement phase, will be hit by a sufficient number of secondary electrons during the compensation phase. The trajectory of the secondary electrons can be controlled by influencing the shape and the strength of the absorption field in the appropriate manner. One of the factors which can contribute to the shaping of the field is an adequate shape of the absorption net 7, e.g. in a hemispherical structural design. Likewise, it is also possible to provide below the absorption net 7 additional electrostatic deflection electrodes, which can, for example, be constructed as segmented electrodes or as mechanically adjustable, additional annular electrodes.

The period of time required for equalizing the charges depends on the time average of the primary electron beam flow in the compensation phase, among other factors. The period of time which is necessary for equalizing the charges can be reduced by increasing the average primary electron beam flow during the compensation phase in comparison with the measurement phase. This can especially be done in stroboscopic measurements by varying the pulse duty ratio, which is adjusted between the blanked beam and the primary electron beam impinging on the specimen. By means of such an intensity modulation of the primary electron beam, a very short compensation phase can be achieved, whereby, in raster mode measurements, the observation of the unit under measurement 5 in the form of a circuit will be simplified, whereas, the spot mode, the measurement time will be reduced.

Fundamentally, it is also possible to use the intensity control of the primary electron beam during the compensation phase for the purpose of controlling the charge compensation by supplying a larger or smaller primary electron beam to the unit under measurement 5 in response to the shift of the surface potential of the insulating surface 4 during the compensation phase. In this way, a constant duration of the compensation phase can be predetermined so as to facilitate the synchronization processes during the measurement. Furthermore, this type of intensity modulation of the primary electron beam can also be used for supporting the local change of the surface potential, which is an intentional change when the unit under measurement 5 is subjected to areawise irradiation in the compensation phase.

Deviating from the above variations, the control of the charge condition of the insulating surface 4 of the unit under measurement 5 can also be effected by varying the voltage of the absorption net 7 used during the second part of the period. The operating point of such an absorption field control is chosen such that only part of the secondary electrons is retarded during the second part of the period of the absorption field. By varying the absorption field voltage during the second part of the period, the percentage of retarded secondary electrons can be influenced. A shift of the surface potential will result in an opposite shift of the percentage of retarded secondary electrons due to the changed potential difference between the absorption net 7 and the surface of the specimen. This control method will result in an additional independent stabilization of the surface potential of the unit under measurement 5.

In the case of the preferred measurement method described at the beginning, a high pass-filtered secondary electron signal is used for controlling the opposing field net voltage, whereas the low-frequency component of the secondary electron beam is used for controlling the surface potential of the unit under measurement 5.

If a slow shift of the potential of the measuring point occurs, e.g. due to a malfunction in the equalization of surface charges, or due to a change in the operating point of the closed-loop control circuit for charge compensation, the time average of the voltage between the opposing field net 10 and the unit under measurement 5 will shift. Due to this shift, the operating point of an opposing field spectrometer will move away from its optimum operating point relative to the energy distribution of the secondary electrons. Hence, it is additionally suggested that the low-frequency component of the secondary electron signal should be included in an e.g. computer-managed control, which, if such a malfunction occurs, will readjust the time average value of the opposing field voltage as soon as the operating point of the opposing field spectrometer excessively deviates from its optimum operating point relative to the energy distribution of the secondary electrons.

The comparatively large time constants occurring in connection with a change in the surface potential permit this produced shift of the average value of the voltage at the opposing field unit 10 to be removed from the measuring signal by averaging during several measurement periods or by subsequent analog filtering or digital post-processing of the measuring signal.

Likewise, it is also possible to provide a combination of the above-mentioned control possibilities of equalizing the surface charges so as to optimize the correction process with due regard to the various measurement modes.

A change in the primary electron beam flow due to a fault in the electron optics or in the beam generation will result in a change of the secondary electron flow leaving the unit under measurement 5. A slow variation of the beam of primary electrons, which may occasionally occur during the measurement, will be interpreted as a shift of the surface potential of the control. In order to avoid an undesirable readjustment of the secondary electron signal, which would result in an undesirable shift of the operating point of the opposing field spectrometer, information on the fluctuation of the primary electron flow may be included in the control. The flow trapped by a spray aperture in the beam path can, for example, be used as a measure for the primary electron beam. Making use of this signal, the secondary electrons signal being measured can be corrected such that the influence on the operating point of the opposing field spectrometer and on the potential of the surface of the unit under measurement will be reduced to a large extent.

The measurement method according to the present invention has been explained with reference to measurements carried out on integrated circuits with a passivation layer. However, the measurement method according to the present invention and the measuring device according to the present invention are also suitable for measuring other units having an insulating surface and a conducting zone which is arranged below the insulating surface and which is to be measured with regard to its voltage.

What is claimed is:

1. A method for contactless measurement of electric potential in a unit under measurement including an insulating surface and at least one conducting zone lying below said insulating surface, comprising the steps of:
   directing a primary electron beam in an evacuated measuring chamber onto the insulating surface above the conducting zone of the unit under measurement;
   generating a secondary electron flow at the insulating surface of said unit, wherein said secondary electron flow is generated by the incidence of said primary electron beam on said insulating surface;
   generating an electric extraction field above the unit under measurement, wherein the electric extraction field is an alternating field which alternates between a positive voltage and a negative voltage, wherein the value of the positive voltage is high when compared to the value of the negative voltage; and
   determining the potential of the conducting zone by measuring the energy of the electrons of the secondary electron flow, wherein the measurement of the energy of the electrons of the secondary electron flow is carried out in synchronism with that partial period of the alternating field during which the high positive voltage is applied.

2. A method according to claim 1 wherein the extraction field has a period duration which is smaller than the charge reversal time constant for surface charges at the insulating surface of the unit under measurement.

3. A method according to claim 1 wherein the extraction field has a rectangular variation with time;
   wherein, during a first part of the period, the extraction field has a high field strength with a polarity absorbing the secondary electrons from the insulating surface of the unit under measurement; and
   wherein, during the second part of the period, the extraction field has, in comparison with the field strength during the first part of the period, a low field strength with a polarity driving the secondary electrons back to the insulating surface of the unit under measurement.

4. A method according to claim 3 wherein the ratio of the first part of the period to the second part of the period is controlled in response to the surface potential of the insulating surface of the unit under measurement in such a way that, in the time average, a low-surface potential will occur at the insulation surface of the unit under measurement.

5. A method according to claim 4 wherein the values of the timeaverage surface potentials is in the range between 0 and 10 volts.

6. A method according to claim 3 wherein, during the first part of the period of the extraction field, the primary electron beam is focussed onto the insulating surface of the unit under measurement for measuring the electric voltage in said unit under measurement; and
   during the second part of the period, the primary electron beam is caused to fall area wise on the insulating surface for supporting the equalization of the surface charges formed on the insulating surface in the measurement phase.

7. A method according to claim 6 wherein the size and the position of the insulating surface irradiated with the primary electron beam during the second art of the period of the extraction field are controlled by rasterlike deflection of the primary electron beam.

8. A method according to claim 6 wherein, by controlling the dwell time, or the flow, or the raster area of the wide primary electron beam during the second part of the period of the extraction field, a locally inhomogeneous shift of the surface potential of the insulating surface will be effected in such a way that, during the first part of the period, the point of impingement of the point-shaped primary electron beam lies within an area in which the secondary electrons will be retarded during the second part of the period.

9. A method according to claim 3 wherein a compensation of the surface charges of the insulating surface of the unit under measurement is effected by influencing the trajectories of the secondary electrons by the shape and/or the strength of the extraction field during the second part of the period in such a way that the area irradiated during the first part of the period by the primary electron beam is hit by a sufficient number of secondary electrons during the second part of the period.

10. A method according to claim 9 wherein the shaping of the extraction field is carried out during the second part of the period by means of a hemispherically shaped extraction net or by electrostatic deflection electrodes which are additionally arranged below the flat extraction net.

11. A method according to claim 3 wherein the average beam flow of the primary electron beam occurring during the second part of the period of the extraction field is increased in comparison with the average intensity of the beam flow of the primary electron beam occurring during the first part of the period of the extraction field.

12. A method according to claim 11 wherein, during the second part of the period of the extraction field, the primary electron beam is controlled in response to the shift of the potential of the insulating surface.

13. A method according to claim 3 wherein, during the second part of the period, the extraction field voltage is controlled in response to the surface potential of the insulating surface of the unit under measurement in such a way that only part of the secondary electrons is retarded.

14. A device for contactless measurement of electric potential in a unit under measurement including an insulating surface and at least one conducting zone lying below said insulating surface, comprising:
a primary beam generating device directing within an evacuated measuring chamber a primary electron beam onto the insulating surface of the unit under measurement above the conducting zone;
an extraction net, which is arranged above said unit under measurement and which has applied thereto an extraction voltage by means of an extraction voltage source, said extraction voltage being used for generating an extraction field in the area above said unit under measurement, wherein the extraction voltage source is an a.c. voltage source, the output voltage thereof alternating between a positive voltage and a negative voltage, wherein the value of the positive voltage is high when compared to the value of the negative voltage; and
a device for measuring the energy of the electrons of a secondary electron flow generated at the insulating surface of the unit under measurement, wherein said second electron flow is generated by the incidence of said primary electron beam on said insulating surface, wherein the measuring device measures the energy of the electrons of the secondary electron flow in synchronization with that partial period of the a.c. voltage produced by the extraction voltage source, during which the high, positive voltage is applied.

15. A device according to claim 14 wherein said a.c. voltage source is a square-wave voltage source adapted to produce a rectangular voltage signal.

16. A device according to claim 15 wherein the period duration of said rectangular voltage signal generated by said a.c. voltage source is shorter than the charge reversal time constant for surface charges at the insulating surface of the unit under measurement.

17. A device according to claim 15 wherein the temporally rectangular voltage signal generated by the a.c. voltage source has, during a first part of its period, a high, positive voltage in comparison with the potential of conducting zones of the unit under measurement, and wherein, during a second part of its period, the voltage signal has a low, negative voltage.

18. A device according to claim 17 wherein said high, positive voltage lies between 1000 and 2000 volts, and said low, negative voltage lies between $-1$ and $-100$ volts.

19. A device according to claim 15 wherein the device for measuring the energy of the electrons of the secondary electron flow further comprises;
a low pass, and the ratio of the rectangular voltage, which is generated by the extraction voltage source, is controlled in response to the output signal of said low pass in such a way that a low, positive surface potential will occur at the insulating surface of the unit under measurement.

20. A device for contactless measurement of electric voltages in a unit under measurement having an insulating surface and at least one conducting zone lying below said insulating surface, said unit being in an evacuated measuring chamber comprising:
a primary beam generating device adapted to direct a primary electron beam into said evacuated measuring chamber and onto said insulating surface of said unit under measurement above said conducting zone;
an a.c. voltage source adapted to generate an extraction voltage, said extraction voltage being adapted to produce an extraction net in the area above said unit under measurement; and
a device for measuring the energy of the electrons of a secondary electron flow generated by said primary beam at the insulating surface of the unit under measurement, said measuring device being adapted to measure the energy of the electrons of said secondary electron flow in synchronization with the part of the period in which said a.c. voltage source generates a positive extraction voltage.

* * * * *